(12) United States Patent
Madhava et al.

(10) Patent No.: US 7,229,701 B2
(45) Date of Patent: Jun. 12, 2007

(54) CHROMIUM AND ACTIVE ELEMENTS MODIFIED PLATINUM ALUMINIDE COATINGS

(75) Inventors: Murali Madhava, Gilbert, AZ (US); Timothy R. Duffy, Chandler, AZ (US); Margaret Floyd, Chandler, AZ (US); George Reimer, Simpsonville, SC (US)

(73) Assignee: Honeywell International, Inc., Morristown, NJ (US)

( * ) Notice: Subject to any disclaimer, the term of this patent is extended or adjusted under 35 U.S.C. 154(b) by 41 days.

(21) Appl. No.: 10/928,545

(22) Filed: Aug. 26, 2004

(65) Prior Publication Data

US 2006/0046091 A1  Mar. 2, 2006

(51) Int. Cl.
 B32B 15/01 (2006.01)
 B32B 37/06 (2006.01)
 B05D 3/00 (2006.01)

(52) U.S. Cl. .................. 428/678; 428/680; 427/383.7; 427/405

(58) Field of Classification Search .................. 428/680
See application file for complete search history.

(56) References Cited

U.S. PATENT DOCUMENTS

| | | | |
|---|---|---|---|
| 3,542,583 A | 11/1970 | Small | |
| 3,918,139 A | 11/1975 | Felten | |
| 4,123,594 A | 10/1978 | Chang | |
| 4,261,742 A | 4/1981 | Coupland et al. | |
| 4,346,137 A | 8/1982 | Hecht | |
| 4,451,431 A | 5/1984 | Naik | |
| 4,526,814 A | 7/1985 | Shankar et al. | |
| 5,401,307 A | * 3/1995 | Czech et al. | 106/14.05 |
| 5,482,578 A | 1/1996 | Rose et al. | |
| 5,492,726 A | 2/1996 | Rose et al. | |
| 5,500,252 A | 3/1996 | Meelu | |
| 5,582,635 A | 12/1996 | Czech et al. | |
| 5,599,385 A | 2/1997 | Czech et al. | |
| 5,688,607 A | 11/1997 | Rose et al. | |
| 5,833,829 A | 11/1998 | Foster | |
| 5,837,385 A | 11/1998 | Schaeffer et al. | |
| 5,939,204 A | 8/1999 | Czech | |
| 5,942,337 A | 8/1999 | Rickerby et al. | |
| 5,989,733 A | 11/1999 | Warnes et al. | |
| 6,001,492 A | 12/1999 | Jackson et al. | |

(Continued)

FOREIGN PATENT DOCUMENTS

EP  0 587 341 A1  3/1994

(Continued)

*Primary Examiner*—John J. Zimmerman
*Assistant Examiner*—Jason L. Savage
(74) *Attorney, Agent, or Firm*—Ingrassia Fisher & Lorenz

(57) ABSTRACT

The present invention provides a chromium and active elements modified platinum aluminide coating that may be used on a surface of a gas turbine engine component such as a turbine blade. The coating may be used as a protective coating that impedes the progress of corrosion, oxidation, and sulfidation in superalloy materials that comprise the substrate of the turbine blade. Additionally, the coating may be used as a bond coat onto which a thermal barrier coating is deposited. The presence of active elements as well as chromium and platinum provides improved corrosion, oxidation, and sulfidation resistance. The coating is applied using an electron beam physical vapor deposition. The coating is applied alternatively using selected sequential diffusion processing steps involving chromium, platinum and aluminum.

27 Claims, 14 Drawing Sheets

U.S. PATENT DOCUMENTS

| | | |
|---|---|---|
| 6,127,047 A | 10/2000 | Worrell et al. |
| 6,180,259 B1 * | 1/2001 | Harada et al. ............... 428/615 |
| 6,183,888 B1 | 2/2001 | Alperine et al. |
| 6,435,830 B1 | 8/2002 | Allen et al. |
| 6,610,419 B1 * | 8/2003 | Stamm ....................... 428/632 |
| 6,645,926 B2 | 11/2003 | Abriles et al. |
| 2003/0118883 A1 | 6/2003 | Darolia et al. |
| 2005/0036891 A1 * | 2/2005 | Spitsberg et al. ........ 416/241 R |
| 2005/0145503 A1 * | 7/2005 | Kozlov et al. ............... 205/255 |
| 2006/0046090 A1 * | 3/2006 | Spitsberg et al. ........... 428/689 |

FOREIGN PATENT DOCUMENTS

| | | |
|---|---|---|
| EP | 0587341 A1 * | 3/1994 |
| EP | 0 654 542 A1 | 5/1995 |
| EP | 0 814 178 A1 | 12/1997 |
| EP | 1 010 774 A1 | 6/2000 |
| EP | 1 111 091 A1 | 6/2001 |
| JP | 410121264 A | 5/1998 |
| WO | WO 91/02108 | 2/1991 |
| WO | PCT/US2005/030458 | 12/2005 |

* cited by examiner

CHROMIUM AND ACTIVE ELEMENTS MODIFIED PLATINUM ALUMINIDE COATINGS

FIELD OF THE INVENTION

The present invention relates to methods and materials for forming a protective coating on metallic industrial items. More particularly the invention relates to a method for applying a coating comprising nickel, chromium, aluminum, platinum, and one or more active elements by PVD, EBPVD or other methods such as multiple-step processes involving diffusion and electroplating noble metals on a superalloy turbine blade and other high pressure turbine components.

BACKGROUND OF THE INVENTION

In an attempt to increase the efficiencies and performance of contemporary jet engines, and gas turbine engines generally, engineers have progressively pushed the engine environment to more extreme operating conditions. The harsh operating conditions of high temperature and pressure that are now frequently specified place increased demands on engine components and materials. Indeed the gradual change in engine design has come about in part due to the increased strength and durability of new materials that can withstand the operating conditions present in the modern gas turbine engine.

The turbine blade is one engine component that directly experiences severe engine conditions. Turbine blades are thus designed and manufactured to perform under repeated cycles of high stress and high temperature. An economic consequence of such a design criteria is that currently used turbine blades can be quite expensive. It is thus highly desirable to maintain turbine blades in service for as long as possible. It is correspondingly desirable to manufacture and finish turbine blades so as to withstand the corrosive and erosive forces that will attack turbine blade materials.

Turbine blades used in modern gas turbine engines are frequently castings from a class of materials known as superalloys. The superalloys include alloys with high levels of cobalt and/or nickel. Therefore, nickel and cobalt based superalloys are thus preferred materials for the construction of turbine components, including blades and vanes. The high strength nickel-based superalloys are noted as precipitation hardening alloys. Nickel, alloyed with elements such as aluminum and titanium, develops high strength characteristics that are sustainable at high temperatures. The strength arises predominantly through the presence of a gamma prime ($\gamma'$) phase which is an intermetallic compound formed between nickel and Al or Ti or both in the material. One characteristic of the advanced nickel-based superalloys is the high degree of gamma prime (60% or more volume fraction) in cast materials.

In the cast form, turbine blades made from superalloys display many desirable physical properties and mechanical properties including high strength at elevated temperatures. Advantageously, the strength displayed by this class of materials remains present even under arduous conditions, such as high temperature and high pressure. Disadvantageously, the superalloys generally can be subject to corrosion and oxidation at the high temperature operating regime. Sulfidation can also occur in those turbine blades subject to hot exhaust gases.

Thus, it has become known to provide coatings or protective layers on engine components, such as turbine blades, that are subject to corrosion, erosion or sulfidation. Many components in the advanced turbine engine hot section, in addition to turbine blades, also require protective coatings for resistance to oxidation, sulfidation, and corrosion. Chromium, aluminum, and other metallic coatings can be used to provide protective layers that are more resistant to corrosion and/or oxidation than is the underlying substrate material. In the case of superalloys, materials such as platinum, aluminum, and chromium can be used to provide protective coatings.

Various coating types and various coating deposition systems have been developed. In extremely high temperature applications, a Thermal Barrier Coating (TBC) may be needed to provide the required heat resistance. A TBC typically is composed of ceramic materials such as zirconia, ($ZrO_2$), yttria ($Y_2O_3$), magnesia (MgO), or other oxides. Yttria Stabilized Zirconia (YSZ) is a widely used TBC. A TBC is often used in conjunction with an underlying metallic bond coat.

Metallic coating systems for use as Environmental Barrier Coatings (EBC) and as TBC bond coatings for gas turbine engine components include diffusion-based coatings and overlay coatings. A diffusion coating may include aluminides and platinum aluminides. Pack cementation used for diffusion coating formation is a common method whereby metallic vapors of the desired coating are carried to the surface of a target and diffused thereon. These diffusion coatings are somewhat limited by the difficulty of codepositing other metals along with aluminum onto the substrate surface.

A common overlay coating used for HPT components is known as MCrAlY. In the conventional formulation of MCrAlY, M represents one of the metals nickel, cobalt, or iron, or combinations thereof. In the designation MCrAlY, Cr, Al, and Y are the chemical symbols for chromium, aluminum, and yttrium. Some conventional MCrAlY formulations are discussed in the following U.S. Pat. Nos. 4,532,191; 4,246,323; and 3,676,085. Families of MCrAlY compositions are built around the nickel, cobalt, or iron constituents. Thus the literature speaks of NiCrAlY, NiCoCrAlY, CoCrAlY, CoNiCrAlY, and so on.

The family of MCrAlY coatings offer an alternative to the diffusion-based coatings in that elements beyond aluminum and platinum are included in the coating, which brings an attendant improvement in corrosion and/or oxidation resistance. However, the MCrAlY coatings are not diffusion coatings and result in a distinct layer from the substrate as the coating; hence they are often referred to as overlay coatings. Many high temperature overlay coatings are produced by processes such as PVD, EBPVD, HVOF and LPPS.

The prior art methods of providing environmental and bond coatings have experienced limitations and drawbacks. For example it is difficult with spray techniques to obtain a homogenous, high-quality and dense coating. Chemical vapor deposition methods suffer from slow deposition rates and a difficulty in accommodating large components. The physical vapor deposition process faces difficulty in deposition rates and in efficiently applying cost effective coatings. And, diffusion coatings are limited in their ability to efficiently provide multiple elements in a single diffusion step. Thus there is an ongoing need for improved methods of applying coatings.

Additionally, coatings can be improved in their effectiveness over a wide spectrum of operating temperature regimes and in response to a range of environmental stresses. For example, platinum aluminide coatings (including the class of platinum modified nickel aluminides) are utilized as straightforward oxidation resistance coatings and as "bond coats" for thermal barrier coating (TBC) applications. But, currently used platinum aluminides do not utilize the beneficial effects of chromium and active elemental additions. Furthermore, there is a need to incorporate chromium, which improves the Type II sulfidation resistance of the coating, to supplement the good Type I sulfidation resistance and oxidation resistance exhibited by the platinum aluminide coatings.

Hence there is a need for an improved method to apply a protective coating. There is a need for an improved coating method that can be easily and effectively applied. Further the composition of the coating should include active elements, as well as chromium in the platinum aluminide coating, in order to provide effective oxidation, corrosion, and sulfidation resistance over a broad temperature range. Such coatings are needed to provide wide spectrum EBC protection for Type I & II sulfidation and high temperature oxidation resistance. Such coatings are needed as well for improved bond coats used for TBC applications. There is additionally a need to provide processing steps to offer duplex coating microstructures which are different for different sections of HPT blades. For instance, gas path surfaces above the platform may require certain coating characteristics whereas the shank portion between the dovetail and blade platform sections may require a different coating microstructure. The present invention addresses one or more of these needs.

SUMMARY OF THE INVENTION

The present invention provides a chromium and active elements modified platinum aluminide coating that may be used on a surface of a gas turbine engine component such as a turbine blade. The coating may be used as a protective coating that impedes the progress of corrosion, oxidation, and sulfidation in a superalloy turbine blade. Additionally, the coating may be used as a blond coat onto which a TBC layer is deposited. The presence of active elements as well as chromium and platinum provides wide spectrum coatings for improved corrosion, oxidation, and sulfidation resistance.

In one embodiment, and by way of example only, there is provided a turbine blade surface coating having a weight composition comprising:

| | |
|---|---|
| Al | about 8 to about 30% |
| Cr | about 5 to about 30% |
| Co | about 3 to about 10% |
| Pt | about 15 to about 45% |
| Hf | about 0.5 to about 8% |
| Si | about 1 to about 6% |
| Y | about 0.05 to about 0.5% |
| X | about 0 to about 5% |
| Ni | balance | wherein X comprises one or more of tantalum, rhenium, or zirconium.

wherein X comprises one or more of tantalum, rhenium, or zirconium.

In an additional embodiment, and by way of example only, there is provided a turbine blade comprising: a superalloy substrate and a bond coating having a weight composition comprising about 24 to about 40% Ni, about 10% to about 15% Cr, about 20% to about 24% Al, about 22% to about 40% Pt, about 1.5% to about 6.0% Hf, and about 3.5% to about 4.5% Si and about 0 to about 0.1% Y. A thermal barrier coating may be deposited on top of the bond coating.

The bond coating can be preferably formed by combination of diffusion coatings and electroplating to incorporate all of the required elements into the coating microstructures. The bond coating may also be deposited onto the substrate by an EBPVD process or PVD or HVOF type technologies.

Other independent features and advantages of the chromium and active elements modified platinum aluminide coating will become apparent from the following detailed description, taken in conjunction with the accompanying drawings which illustrate, by way of example, the principles of the invention.

DETAILED DESCRIPTION OF A PREFERRED EMBODIMENT

The following detailed description of the invention is merely exemplary in nature and is not intended to limit the invention or the application and uses of the invention. Furthermore, there is no intention to be bound by any theory presented in the preceding background of the invention or the following detailed description of the invention. Reference will now be made in detail to exemplary embodiments of the invention, examples of which are illustrated in the accompanying drawings. Wherever possible, the same reference numbers will be used throughout the drawings to refer to the same or like parts.

It has now been discovered that an improved corrosion, oxidation, and sulfidation resistance can be achieved for gas turbine engine components by a codeposition of materials onto the surface of the component. In this method an alloy including multiple desired elements is prepared. The metals in the alloy are then deposited onto a component substrate by a method such as electron beam physical vapor deposition (EBPVD). Other overlay coating procedures can be used as well. The components of the alloy are selected to yield improved and enhanced environmental performance.

In one embodiment, a coating alloy is comprised of aluminum, chromium, cobalt, platinum, hafnium, silicon, yttrium, nickel, and other trace elements. Composition ranges for the modified platinum aluminide coatings are as follows in weight percent. The trace elements, X, represent refractory elements such as tantalum, rhenium, zirconium, etc.

| | |
|---|---|
| Al | about 8 to about 30% |
| Cr | about 5 to about 30% |
| Co | about 3 to about 10% |
| Pt | about 15 to about 45% |
| Hf | about 0.5 to about 8% |
| Si | about 1 to about 6% |
| Y | about 0.05 to about 0.5% |
| X | about 0 to about 5% |
| Ni | balance |

In an alternative preferred embodiment, cobalt and refractory elements are omitted from the formulation. Some specific embodiments of this platinum alumide coating include the following compositions designated A through H. It is noted that in each of these compositions the weight percentage of each elemental component is nominal.

| ELEMENT | A | B | C | D | E | F | G | H |
|---|---|---|---|---|---|---|---|---|
| Ni | 32 | 27 | 30 | 40 | 34 | 30 | 24 | 24 |
| Cr | 10 | 15 | 15 | 10 | 10 | 15 | 10 | 10 |
| Al | 22 | 22 | 22 | 21 | 24 | 23 | 24 | 21 |
| Pt | 28 | 28 | 25 | 24 | 24 | 22 | 34 | 40 |
| Hf | 4.5 | 4.5 | 4.5 | 1.5 | 3.5 | 6.0 | 3.5 | 1.5 |
| Si | 3.5 | 3.5 | 3.5 | 3.5 | 4.5 | 4.0 | 4.5 | 3.5 |

The formulation that lacks cobalt has a preferred composition range as follows: about 24 to about 40% Ni, about 10% to about 15% Cr, about 21% to about 24% Al, about 22% to about 40% Pt, about 1.5% to about 6.0% Hf, and about 3.5% to about 4.5% Si.

In one preferred embodiment of the process the desired elements are codeposited using EBPVD. In this embodiment all elements are combined into ingots. The ingots are then used as feed material for the EBPVD process.

Figure 1:
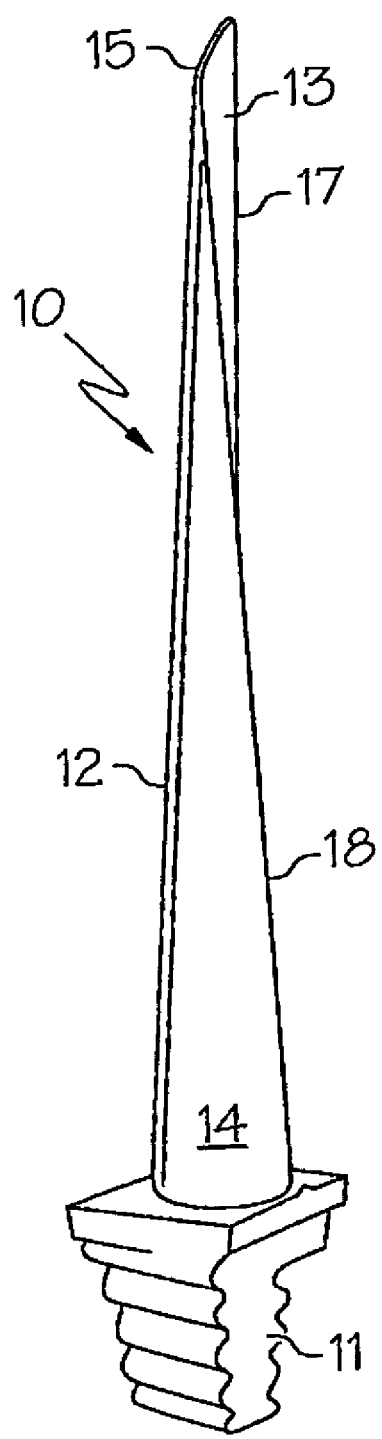
FIG. 1 is a schematic view of a turbine blade used in an embodiment of the present invention.

Referring now to FIG. 1 there is shown a gas engine turbine blade 10 which is a typical target for use with the coatings of the present invention. In general, turbine blade geometry and dimension are designed differently, depending on the turbine engine model and its application. For aero engines, such a blade is typically several inches in length. A turbine blade includes a serrated base assembly 11, also called a mounting dovetail, tang, or Christmas tree. Airfoil 12, a cupcake structure, includes a concave face 13 and a convex face 14. In the literature of turbine technology airfoil 12 may also be referred to as a bucket. Turbine blade 10 also includes leading edge 17 and trailing edge 18 which represent the edges of airfoil 12 that firstly and lastly encounter an air stream passing around airfoil 12. Turbine blade 10 also includes tip 15. Tip 15 may include raised features known as "squealers" (not shown) in the industry. Turbine blade 10 is often composed of a highly durable material such as a nickel-based superalloy. It is also desirable to cast turbine blades as directionally solidified or as a single crystal superalloy in order to maximize elevated-temperature properties and dimensional stability.

In one preferred embodiment, airfoil 12 is coated with a coating of the present invention. The Christmas tree structure is not coated. Alternatively, all surfaces of blade 10 may be coated. It is noted that the airfoil 12, concave face 13, and convex face 14, are curved structures. The complex curves in these structures require care when a line-of-sight deposition process is used.

In an EBPVD process, high energy electron beams generated by electron guns are directed to melt and evaporate a source material. Preferably the source material comprises ingots of a desired alloy. The beams are also used to preheat the substrate target. This occurs inside a vacuum chamber. A typical arrangement includes multiple electron guns, of which a set of the guns are directed at the substrate material, and a different set of the guns are directed at the source of coating materials. A typical gun energy is about 45 kW. An acceptable gun array includes six electron guns of 45 kW energy. A three ingot feed arrangement is acceptable.

Figure 2:
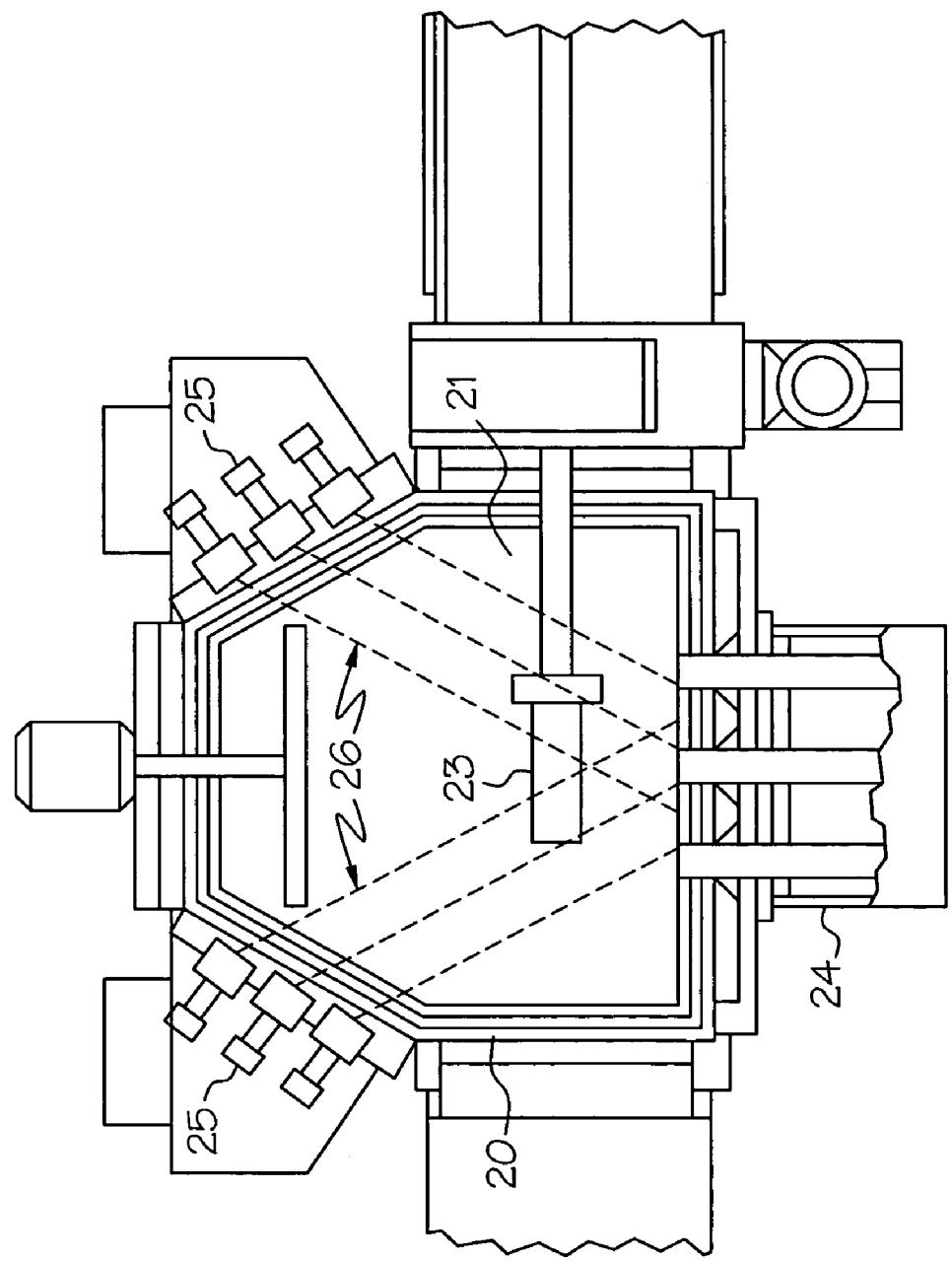
FIG. 2 is a schematic view of an EBPVD apparatus used according to an embodiment of the present invention.

A typical apparatus used in the EBPVD process is shown in FIG. 2. Housing 20 provides a vacuum chamber with a hollow interior 21. Housing 20 typically includes a door or port (not shown) providing access to the chamber interior. The door can be closed so as to seal housing 20. A vacuum pump or series of vacuum pimps (not shown) are in fluid communication with housing 20 through a vacuum hose. Vacuum may be applied up to approximately $10^{-4}$ torr.

A target item, such as turbine blade 10, can be held by part manipulator 23 within the chamber interior. Manipulator 23 includes a rotary drive that is capable of rotating the target item at a desired rotation. A typical rotation is between 0 and approximately 100 rpm.

In a preferred embodiment a three ingot feeder 24 provides raw materials for use in the deposition process although other arrangements are acceptable. The ingot feeder 24 preferably has a shape to receive cylindrical ingots, such as ingots with a diameter of approximately 70 mm. The ingots may be up to approximately 500 mm in length. Mass deposition rates may be varied by using one, two, or three of the ingot feeders. Also, the ingot feeder can provide a feed rate of between approximately 0 to approximately 15 mm per minute. In a preferred embodiment, a single cylindrical ingot with a desired alloy composition can be prepared. This single ingot can then be cut to provide three separate ingots that fit into the three ingot feeder.

Guns 25 comprise electron guns disposed on the exterior of housing 20. The guns 25 are positioned so that electron beams 26 can impinge upon various locations within housing 20. Thus, for example electron beams 26 can impinge upon ingots within ingot feeder 24. Further the beams 26 can also impinge upon a target held by manipulator 23. Preferably guns 25 comprise multiple guns disposed on opposing sides of housing 20.

EBPVD relies on a line of sight deposition. Thus the deposition of coatings on complex surfaces such as turbine blades and vanes requires that the target item be rotated. In the preferred EBPVD process turbine blades are rotated at any rotational velocity up to about 100 rpm.

In an alternative embodiment, the elements platinum, chromium, and optionally, active elements are codeposited using the EBPVD process. An aluminizing step which may involve low activity, intermediate and high activity processes then follows. During aluminizing, the desired platinum aluminides are formed.

Having described the invention from a structural standpoint, a method of using the invention is now described.

In one embodiment, alloys of a desired metallic composition are first prepared. The alloy composition includes those metallic elements that it is desired to deposit by the process. Alloys can be manufactured using conventional arc melt-drop casting technique. It is desired that ingots or bars of the resulting alloy avoid concentrated areas having a preponderance of one or more elements and a lack of other elements i.e., undesirable segregational effects. It is desired that the alloy provide a homogeneous blend of all elements also with due consideration to different vapor pressures of constituent elements so that the deposition of the elements may be uniform.

The overlay coating of the desired alloy is preferably deposited using electron beam physical vapor deposition (EBPVD). However, other PVD techniques may also be used including sputter physical vapor deposition and ion plasma deposition. During the deposition process a desired thickness of material is deposited onto the substrate surface. In a preferred embodiment a desired thickness of between about 5 to about 150 micrometers is deposited, and more preferably the coating thickness will be between about 25 and about 50 micrometers. The desired thickness will be chosen to provide a desired level of protection to the substrate and/or an adequate source of aluminum for a TBC layer. The overlay coating of desired chemistries may also be accomplished using LPPS, HVOF and other overlay coating processes.

An optional heat treatment or diffusion step can be applied to the coated component after the EBPVD step. Such a heat treatment is preferably at a temperature of between about 1800° F. to about 2100° F. and lasts from about one to about five hours. The homogenization heat treatment step may be employed to relieve thermal stresses in the coated component as well as to provide an intermetallic diffusion between the substrate material and the coating. As is known in the art, the heat treatment may take place in an inert atmosphere or vacuum.

In another preferred embodiment, separate from the EBPVD process, a combination of diffusion process steps and noble metal deposition steps is utilized to generate the coatings of the present invention. There are two preferred methods that may be used to produce the coatings of the current disclosure.

The first method, referred to as Method A, requires performing on superalloy parts, a set of sequential processing steps. These steps include:
(1) forming an active elements modified chromium diffusion coating as described below. A chromium diffusion alone can be used if active elements are not desired to be included;
(2) depositing noble metals such as platinum to a thickness in the range of 3 to 12 microns through known procedures such as electroplating or PVD techniques;
(3) performing a diffusion cycle in the temperature range of approximately 1800° F. to 2000° F. to form a Ni/Cr/Pt layer with or with-out active elements;
(4) performing a Low Activity or Intermediate Activity or High Activity aluminizing to generate coating microstructures; and
(5) optionally performing a post coat diffusion treatment in the 1900° F. to 2025° F. temperature range.

The second method, referred to as Method B, also requires a series of sequential processing steps on a superalloy part. These steps include:
(1) depositing Noble metals such as platinum to a thickness in the range of about 3 to 12 microns as noted in step 2 of Method A;
(2) diffusing Noble metal in the 1800° F. to 2000° F. temperature range;
(3) performing a chromium or active elements modified chromium diffusion coating as described below;
and then performing steps (4) and (5) as noted in Method A.

In the initial three steps of both Method A and Method B, which steps lead to placing the item in a pre-aluminizing condition, the three major elements Cr, Pt and Ni are predominantly involved in the diffusion process (although some secondary diffusion of substrate elements are encountered). Essentially, in Method A, a platinum diffusion is effected through a nickel-chromium layer. In Method B chromium diffusion is effected through a platinum-nickel layer. In any case, it is apparent from the ternary Ni/Pt/Cr phase diagram (Reference: ASM Handbook of Ternary Phase Diagrams) that under equilibrium conditions, for the composition range of interest, uniform solid solutions should be prevalent at a temperature of 1060° C. (1940° F.), which is close to the coating/diffusion coating conditions. However, even under non-equilibrium conditions for both Methods A and B sufficient diffusion can be accomplished to produce the needed concentrations of Cr and Pt for subsequent alumization and coating formation. In both Method A and B the follow-on aluminizing and post heat treatment cycles will produce the coating chemistries specified in this disclosure. Moreover, by utilizing the different aluminizing processes, the microstructural characteristics of phases and the distribution of the four major elements Pt, Ni, Cr and Al in the various phases can be advantageously tailored to accommodate varying operating conditions.

Utilization of Method A or B, hence provides two means (or paths) to produce active elements and chromium containing platinum nickel aluminide microstructures exhibiting the coating chemistries of interest. Such coating chemistries would provide the advantages sought in the wide spectrum coatings of the current invention.

The following brief experimental description of Methods A and B provides an exemplary illustration of results obtained from those methods. In the following experiment, the substrate material was Conventionally Cast (CC) and Directionally Solidified (DS) MarM 247 superalloy in the form of about half-inch diameter rod. The chromium diffusion was carried-out with a pack composition of 20 weight % Cr powder plus 79% alumina plus 1% ammonium chloride activator at 1975° F. plus/minus 25° F. for about 8 hours duration. The Noble metal platinum was electroplated and diffused at approximately 1900° F. for about 1.5 hours. All samples of Method A and B were aluminized (steps 3 and 4) in the same run using a Low Activity Vapor Phase aluminizing cycle. (An acceptable Low Activity Vapor Phase aluminizing cycle includes heating at approximately 1975° F. for approximately 4 hours using an out of pack procedure.)

The chromium diffusion on MarM 247 (first step in Method A) produced an average value of 17.5 weight % Cr in the coating of about 12 microns thick, although the locally measured values varied between 14 to 24 weight percent depending on the measurement location. The noted average nickel content was typically 50 weight percent. Other substrate elements such as Co, W, Ta, Hf and Mo were also present in total up to 20 percent by weight. In the case of platinum diffusion on MarM 247 (first step in Method B), the average weight content of the important elements in the coating was 39% Ni, 36.5% Pt, 6.5% Co, 5.6% Cr, 5.9% W and smaller concentrations of other substrate elements. After the first three steps for both Methods were completed, the overall general chemistry of major elements in the diffused surface layer prior to aluminization is provided in Table 1.

TABLE 1

| Method and Process Sequence | Number of Readings for Average | Average Weight Percentage | | | | |
|---|---|---|---|---|---|---|
| | | Cr | Co | Ni | Pt | W |
| Method A; Cr diffusion, Electroplate Pt plus 1900 F. diffusion | 16 | 10.2 | 4.8 | 26.2 | 45.5 | 4.5 |
| Method B; Pt plating plus 1900° F. Diffusion then Cr diffusion | 8 | 17.2 | 6.3 | 35.5 | 27 | 5.7 |

Figure 3A:
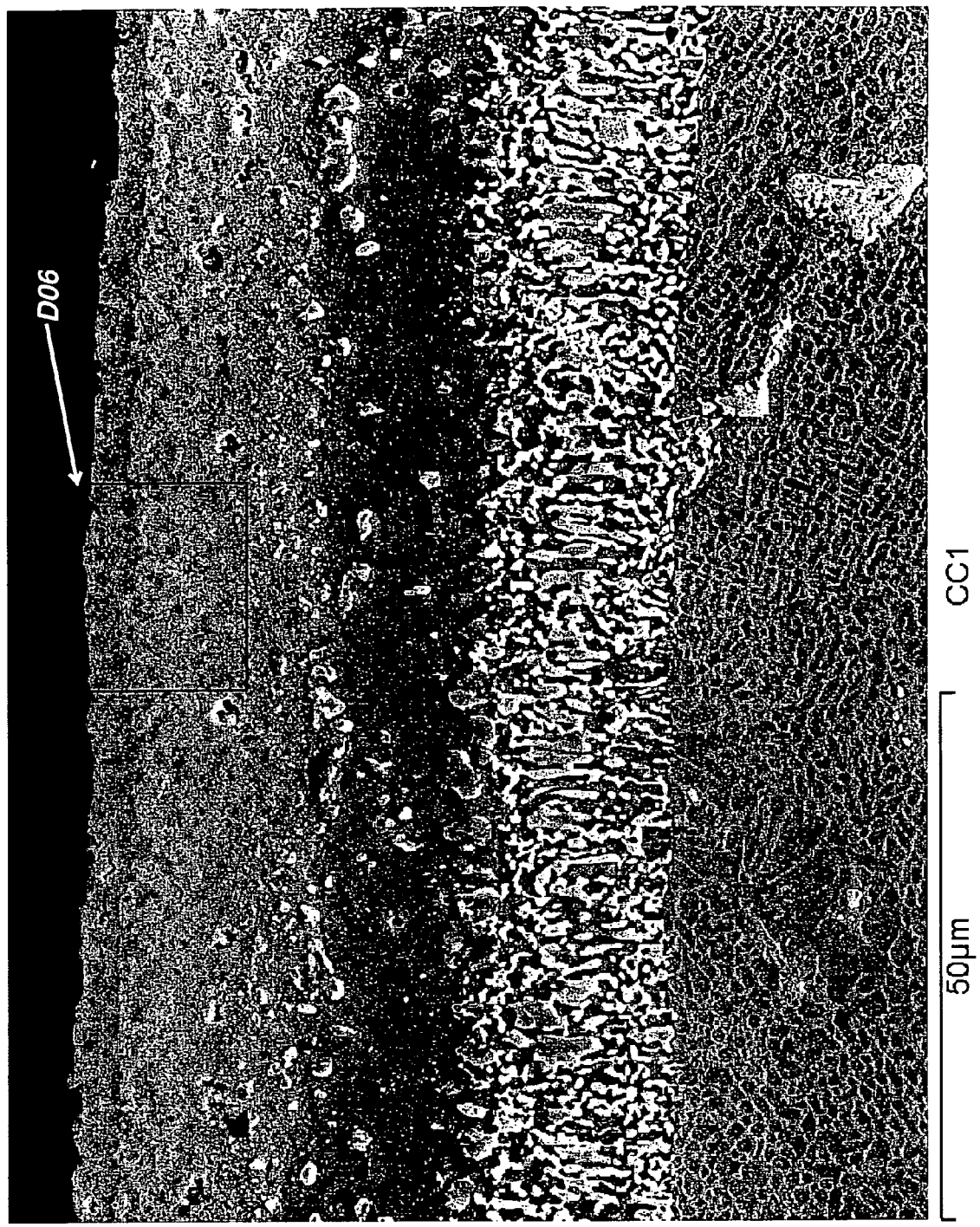
FIGS. 3A and 3B represent typical SEM Micrographs of the multiphase chromium modified platinum nickel aluminide coating produced through Method 'A'.
Figure 3B:
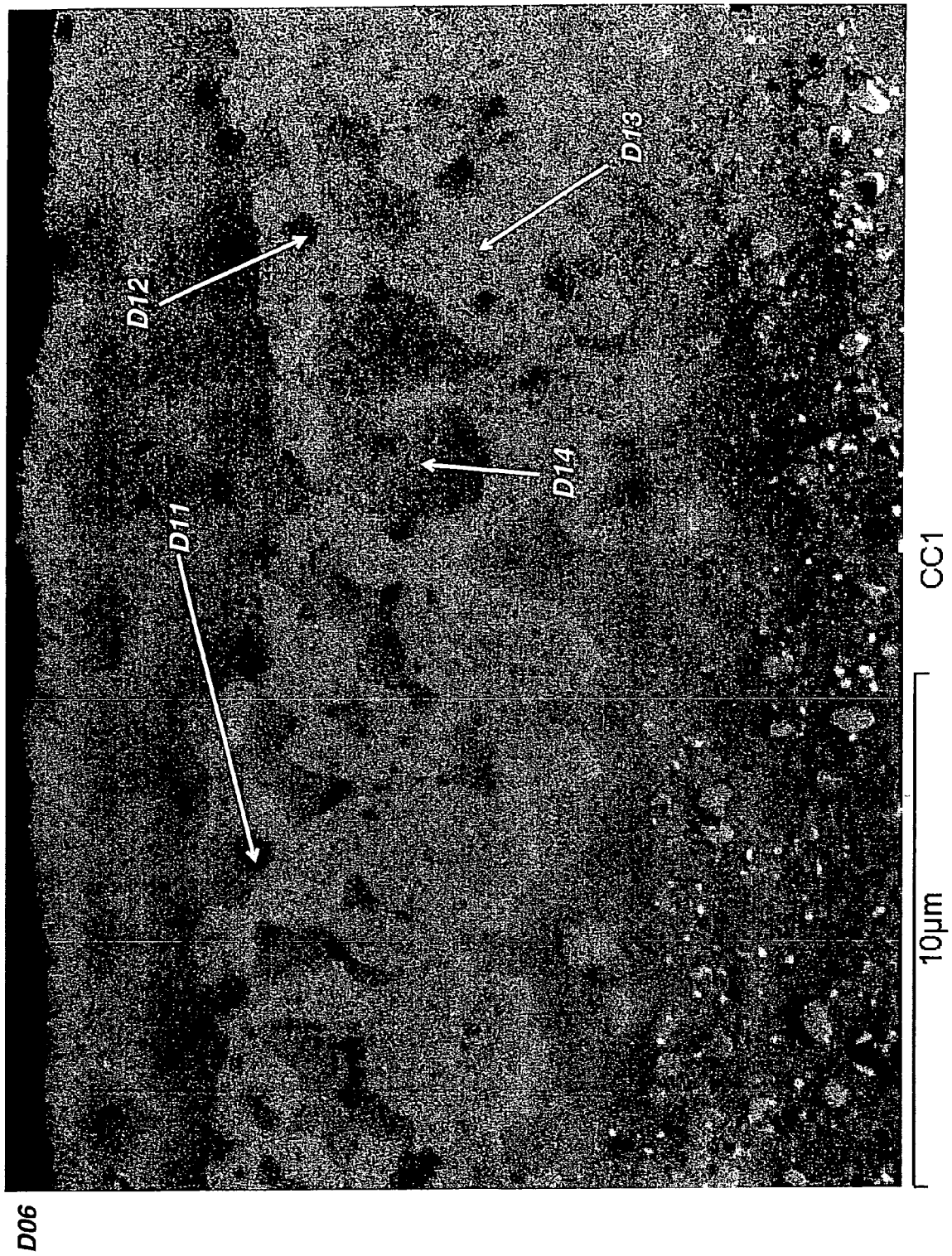
Figure 4A:
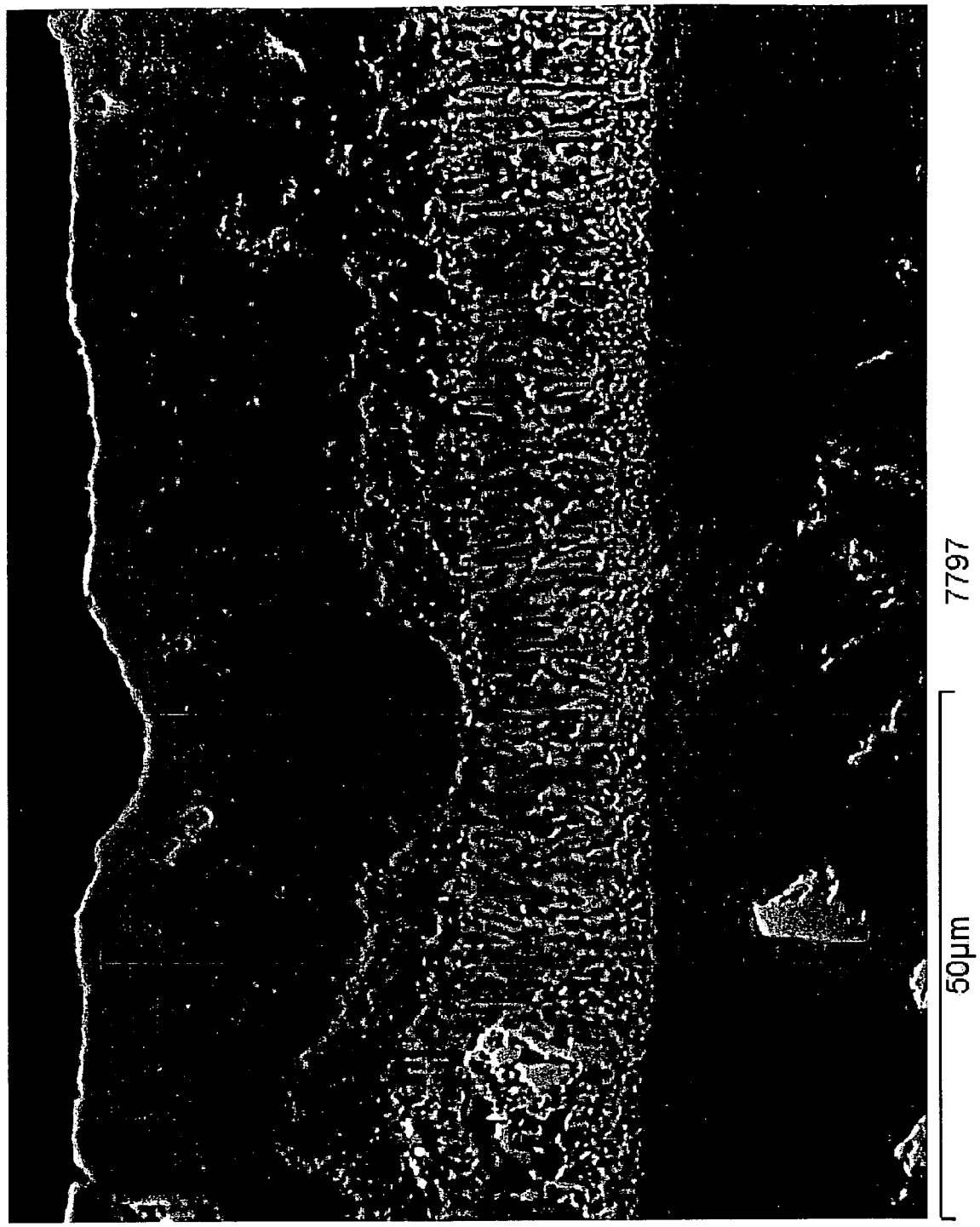
FIGS. 4A and 4B represent typical SEM Micrographs of chromium modified platinum nickel aluminide coating produced through Method 'B'.
Figure 4B:
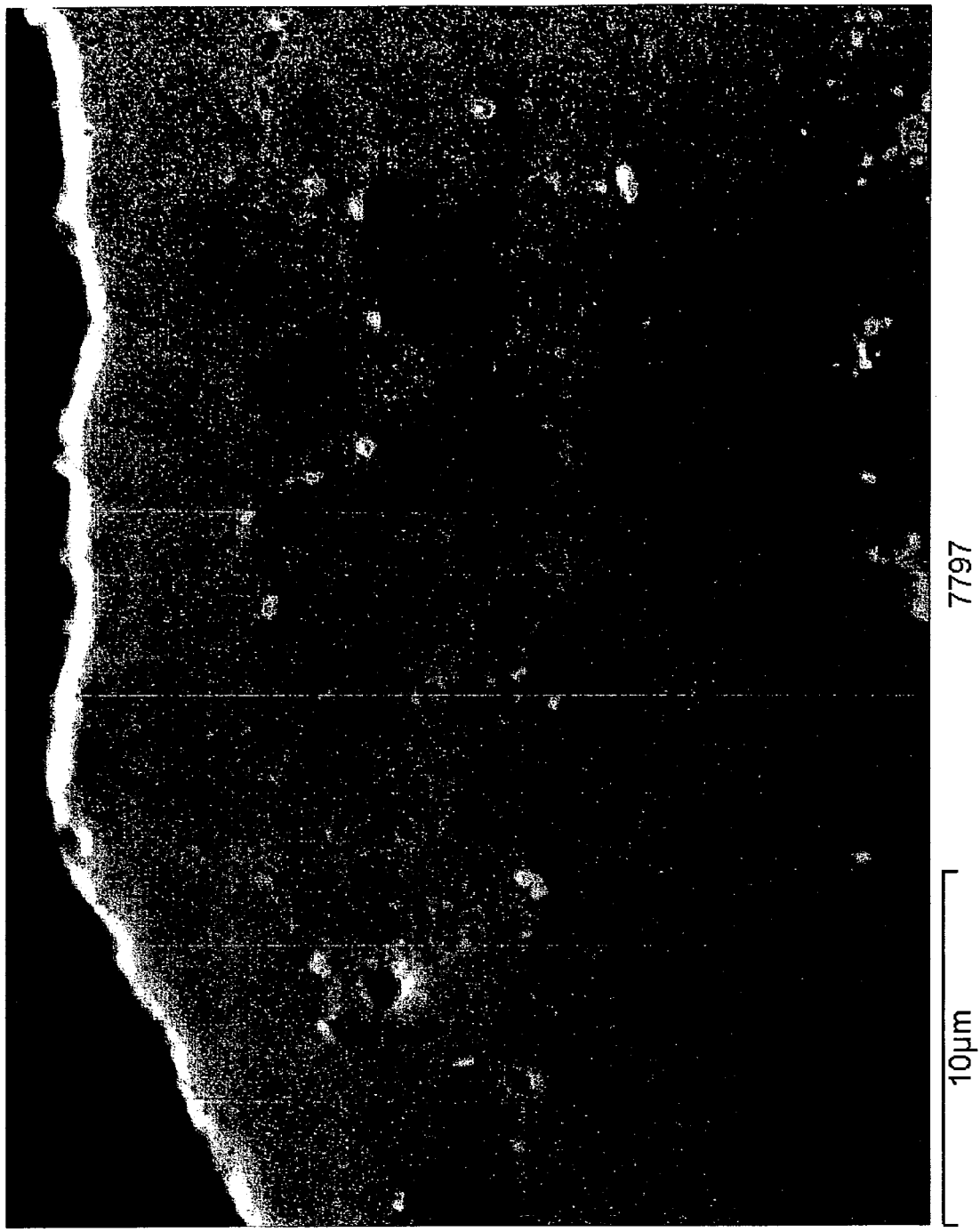
Figure 5:
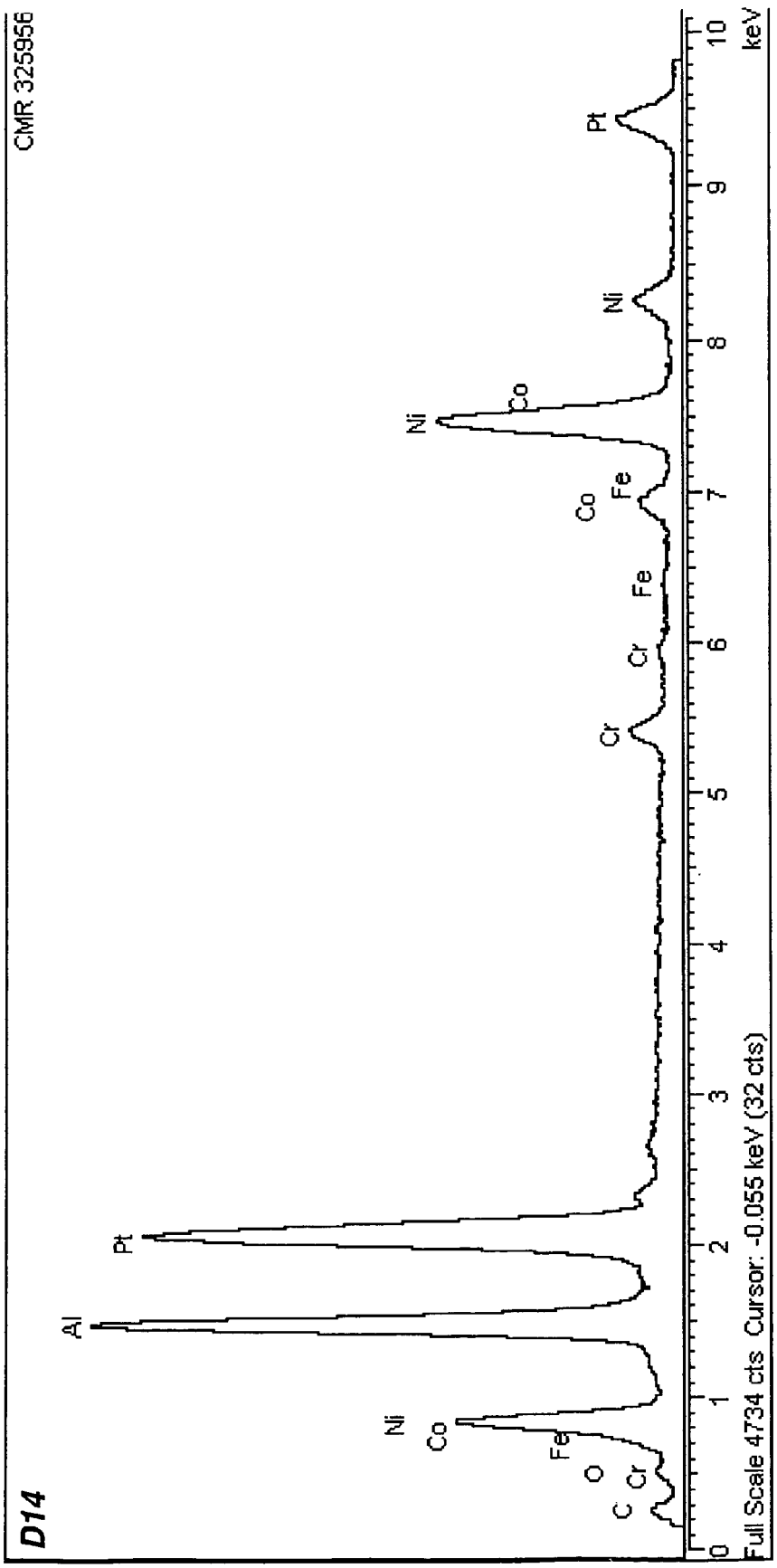
FIG. 5 is the SEM X-Ray Diffraction Pattern of Gray Phase in the additive layer of Method 'A' [location D 14 in FIG. 3($b$)].
Figure 6:
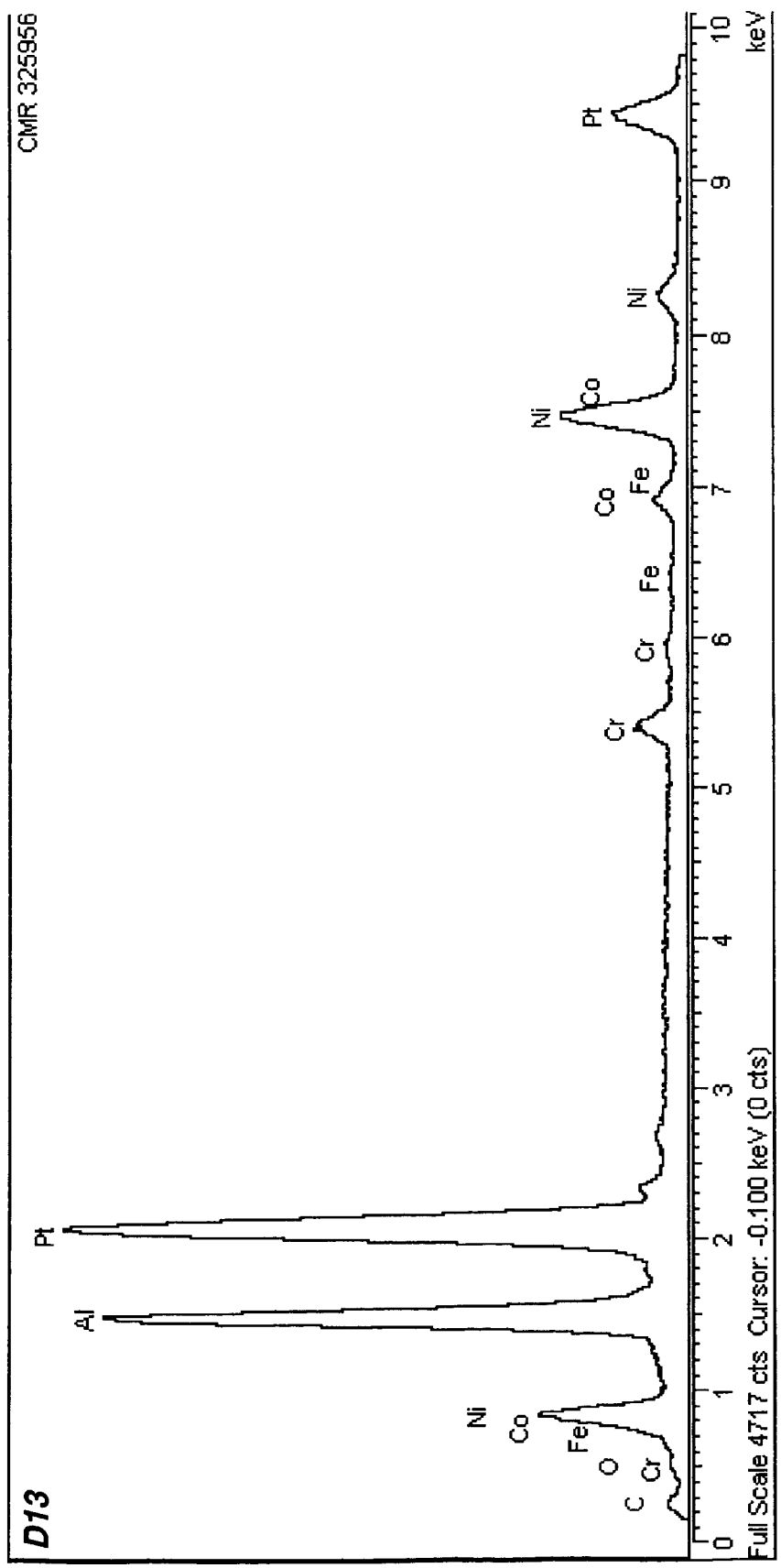
FIG. 6 is the SEM X-Ray Diffraction Pattern of Bright Contrast Phase in the additive layer of Method 'A' [location D13 in FIG. 3($b$)].
Figure 7:
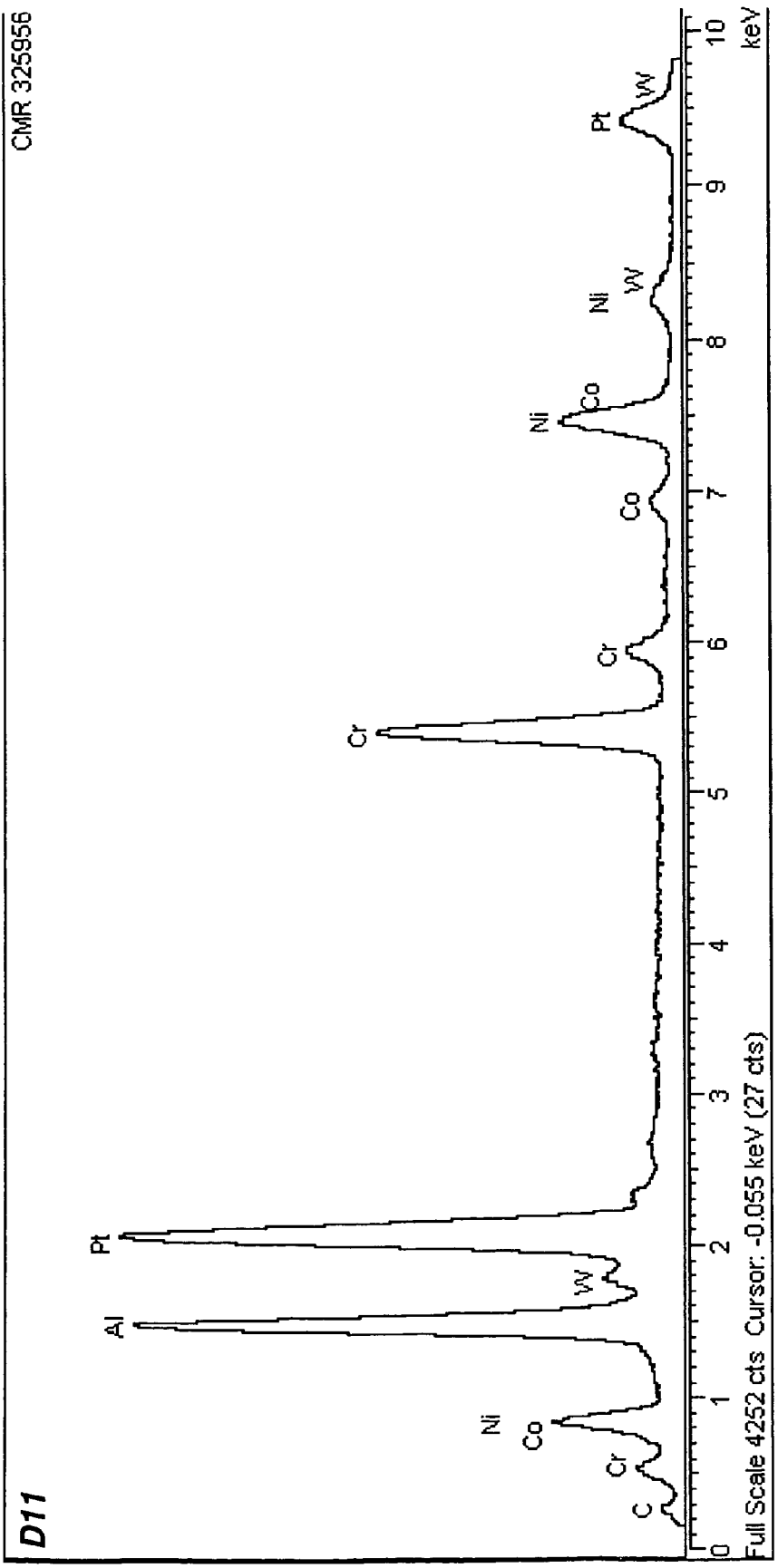
FIGS. 7 and 8 represent the XRD patterns of the submicron size precipitates in the additive layer of Method 'A' [locations D11 & D12 in FIG. 3($b$)].
Figure 8:
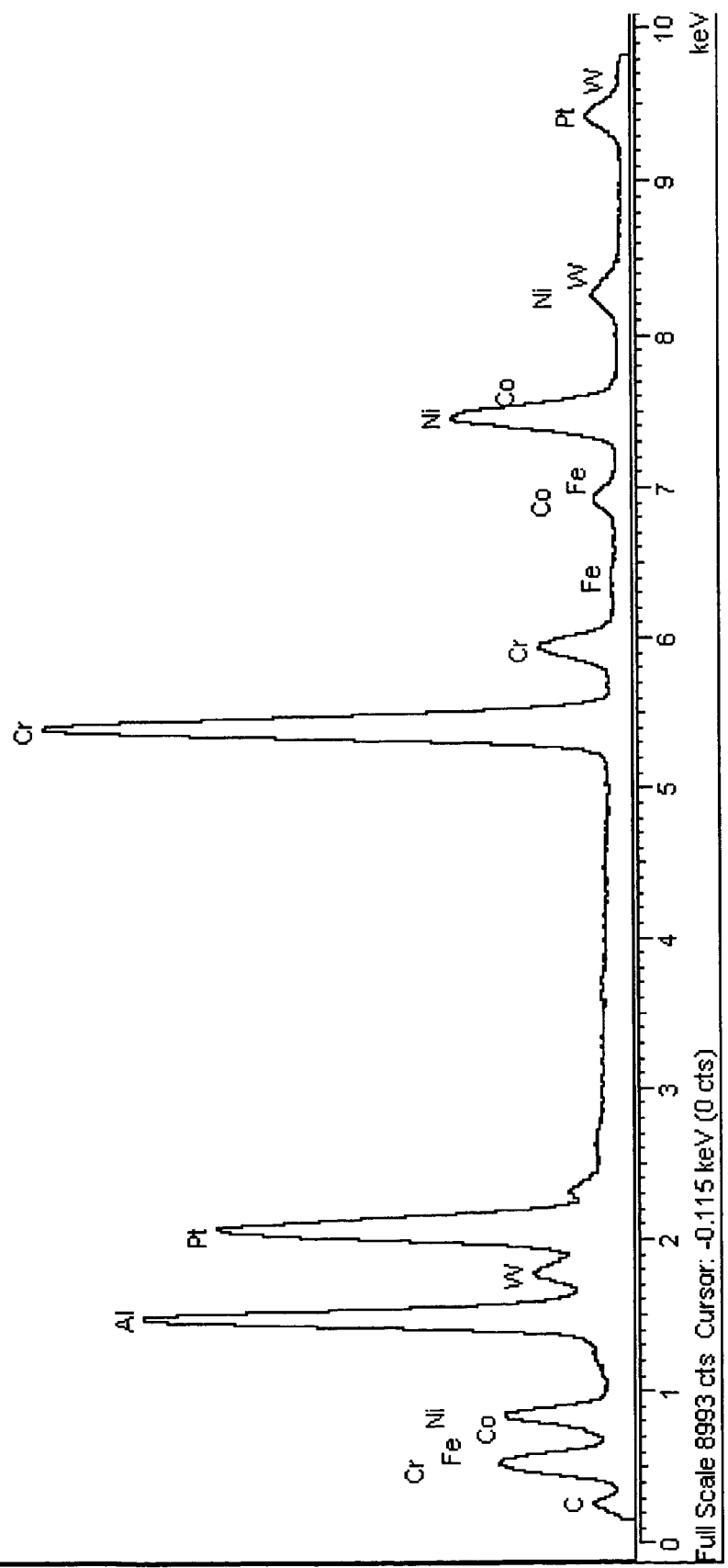

It is apparent from the results noted in Table 1 that the two methods produce a different distribution of the three major elements Cr, Ni and Pt. For the processing conditions noted earlier, Method A has naturally produced a higher Pt concentration (45.5 vs. 27), lower Ni concentration (26.2 vs. 35.5) and a lower Cr concentration (10.2 vs. 17.2) as compared to concentrations achieved in Method B. The other two elements Co and W appear to have diffused from the substrate and the concentrations are comparably similar for both diffusion paths. Although the compositional make-up is different, reference to the Ni/Pt/Cr Ternary Phase Diagram would indicate that at 1060° C. the observed chemistries for both methods would exist in a single phase field. However, the application of same Low Activity Vapor Phase Aluminization cycle produced a multi phase additive layer for Method A, whereas for Method B a Single Phase additive layer was produced. The diffusion zone for both methods appeared to be similar, as can be expected. The noted coating thickness of about 53 microns (2.1 mils) for Method A and 51 microns (2.0 mils) for Method B was comparably similar in the example. The typical multiphase coating microstructure produced for Method A is presented in FIGS. 3A and 3B. FIGS. 4A and 4B represent the single phase type obtained for Method B processing. It is also apparent that the additive layer shown in FIG. 3B exhibits three different phases in the microstructure. The gray phase (location D14) and bright phase (location D13) represented in FIG. 3B, whose EDX patterns are depicted in FIGS. 5 and 6 indicate that they are Beta (PtNi) Al and $PtAl_2$ phases. Both these phases also show considerable amounts of Co and Cr solubility. Furthermore, the $PtAl_2$ phase (D13, FIG. 6) shows considerably extensive solubility for nickel. But the most important feature in the additive layer is the generation and presence of sub-micron sized precipitates dispersed with-in the other two phases. The XRD patterns of two such particles D11 & D12 are shown in FIGS. 7 and 8 respectively. While not wishing to be bound by any theory, the noted presence of large concentrations of Pt, Cr, Ni and Al in these sub-micron sized precipitates likely indicates the formation of a totally new phase in the Platinum Nickel Aluminide Coatings System.

Figure 9:
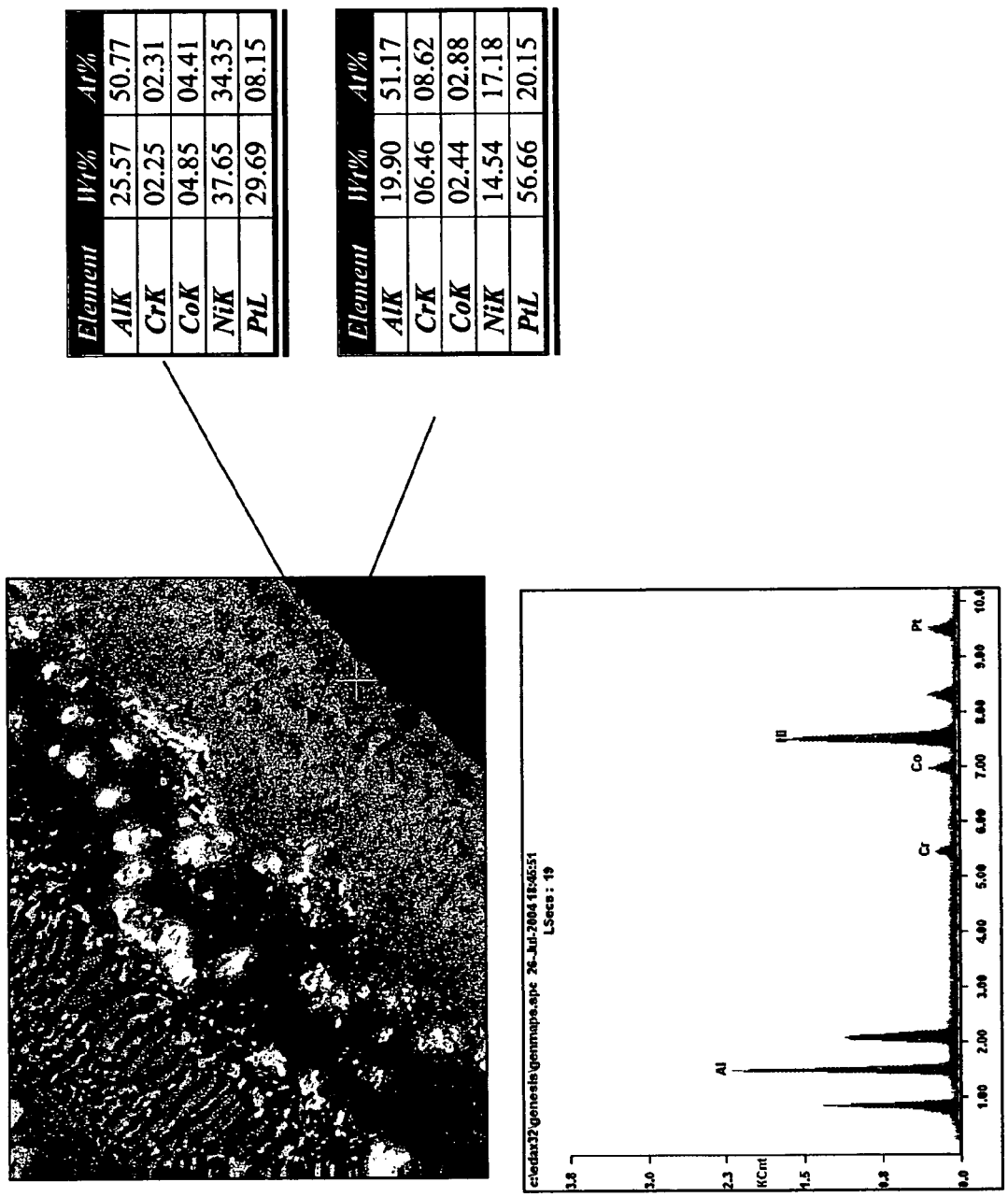
FIG. 9 show the EDAX analyses of the Gray and Bright Phases present near the surface of additive layer of Method 'A'.
Figure 10:
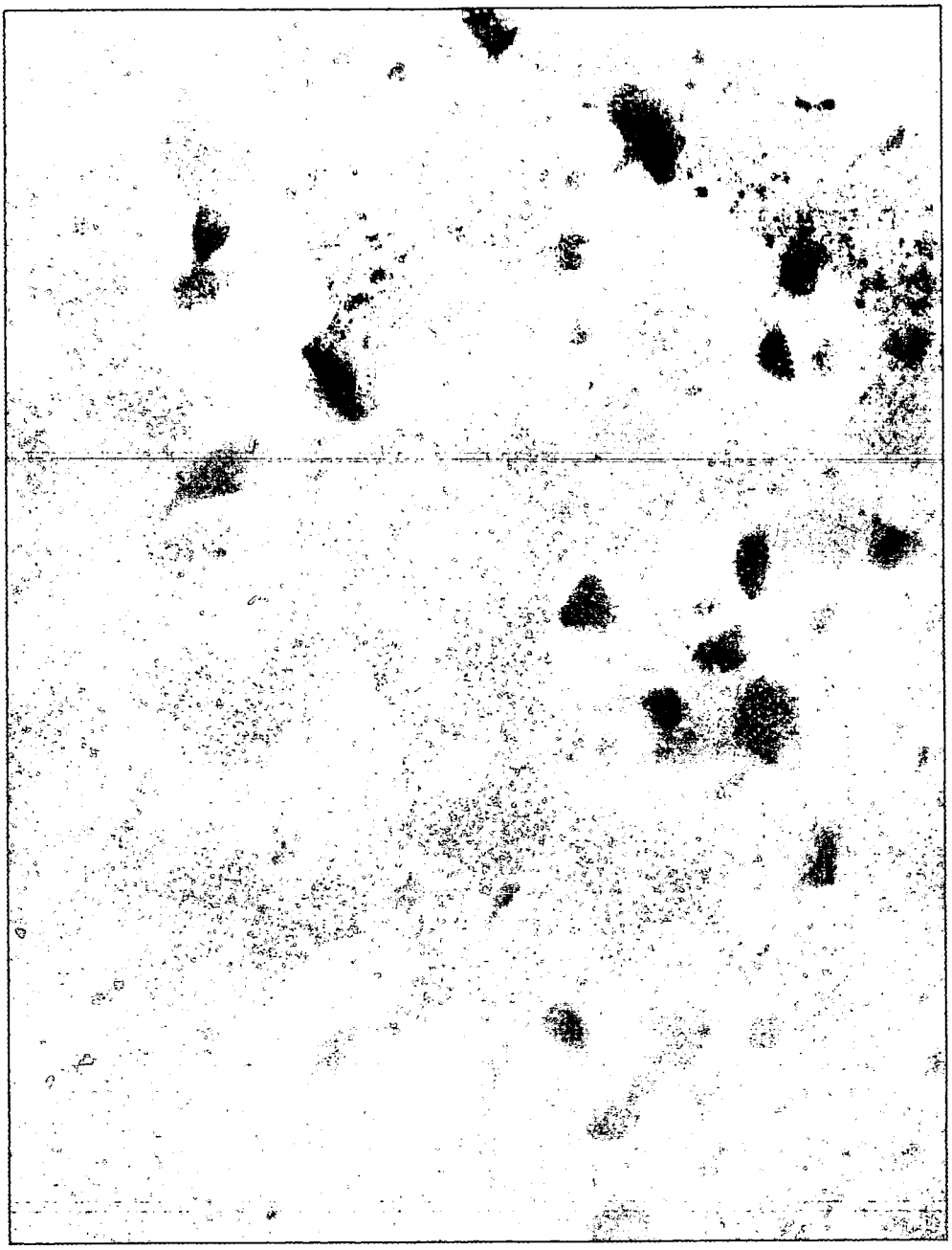
FIG. 10 represents the high resolution micrograph of the additive layer produced by Method 'A' and shows the fine scale precipitation of the third phase.
Figure 11:
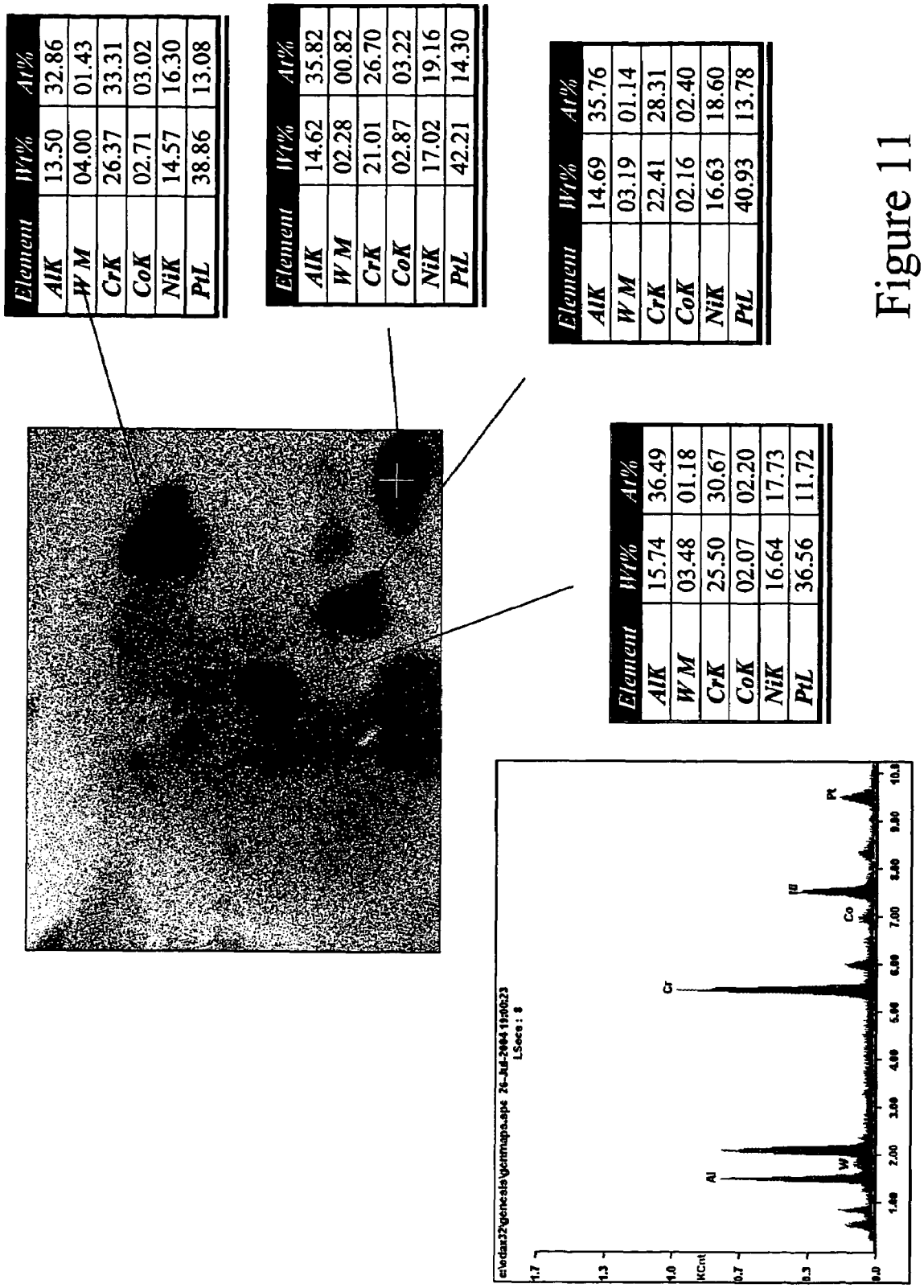
FIG. 11 shows the EDAX analyses of the sub-micron sized precipitates in the additive layer of Method 'A'.

The additive layer produced by Method A was further characterized by ESEM in the "unetched" condition. The analysis presented in FIG. 9 shows that the gray phase (similar to D14 noted earlier) and bright phase (similar to D13 noted earlier) correspond to the Beta (PtNi) Al and nickel enriched $PtAl_2$ phases of the familiar dual phase Platinum Nickel Aluminide coating system. More interestingly however, the higher resolution micrograph depicted in FIG. 10 shows very clearly the precipitation of a third new phase in the additive layer. It is apparent that this high Cr containing phase (similar to D11 & D12 noted earlier) is precipitated within the Beta (PtNi)Al and Nickel enriched $PtAl_2$ phases as very fine particles. In FIG. 11, analyses of flour such fine scale particles is presented. The weight percentage analyses showed the chemistry range for these particles to be 36.56 to 42.21 Pt, 21 to 26.37 Cr, 14.57 to 17.02 Ni, and 13.5 to 15.74 Al, and with small amounts of Co & W included as well. Now by considering the noted "Atomic Concentrations" and designating (Pt+Ni) as PN, (Cr+Co+W) as CR, the average 'atomic composition' of the New Phase was found to be $PN_{31.17} CR_{33.6} Al_{35.23}$, which in effect appears to be composed of one third each as an Atomic Concentration. Since this Platinum/Chromium/Nickel/Aluminide phase is considered as a newly developed phase, henceforth, it is designated as the "LI Phase" in the High Temperature Platinum Aluminide Coating System.

Figure 12:
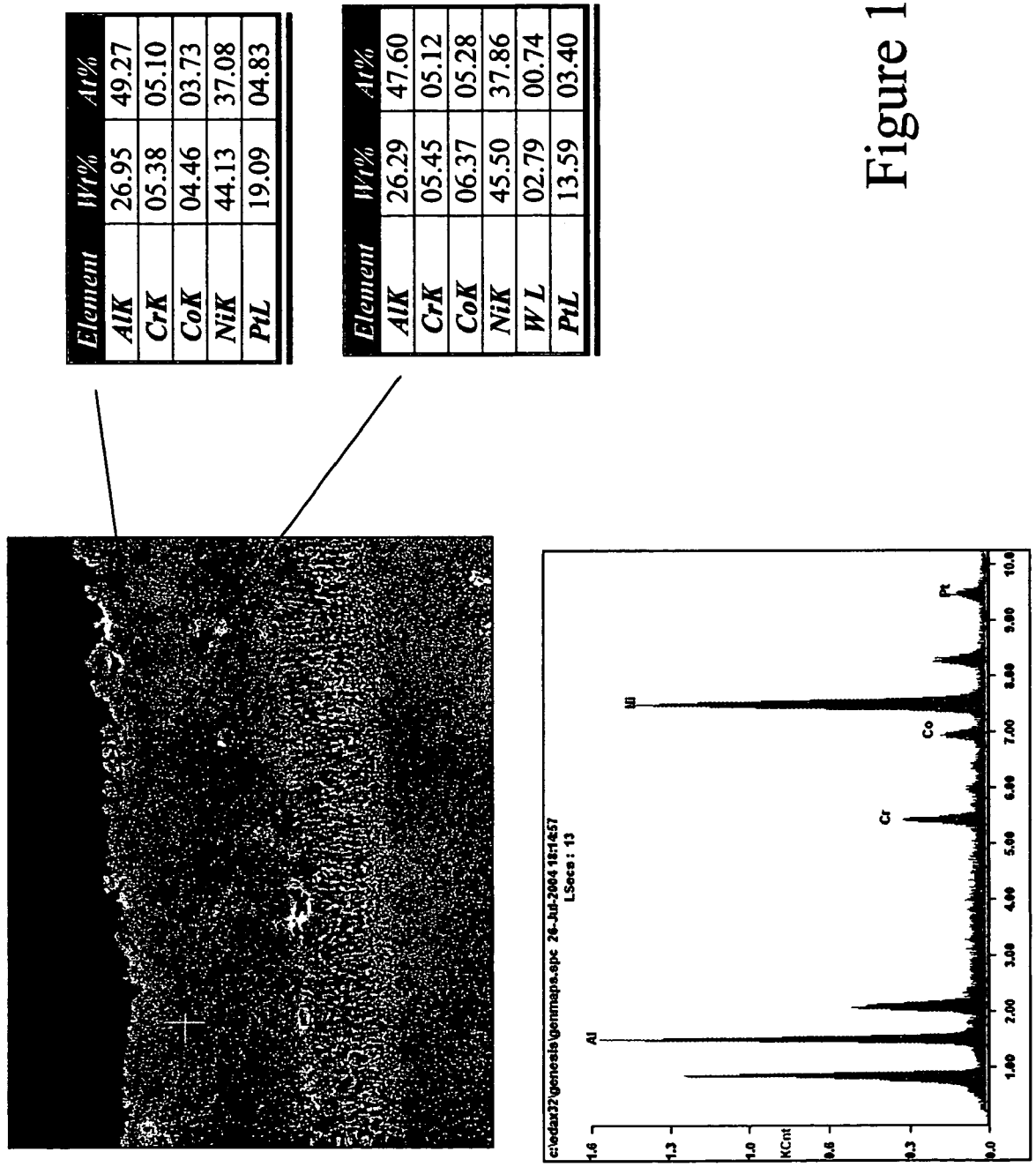
FIG. 12 shows the SEM analyses of the Single Phase Type additive layer produced by Method 'B'.

The single phase type additive layer produced by method B was also evaluated by ESEM in the "unetched" condition. The results are presented in FIG. 12. The EDAX analyses indicate that the additive layer is probably single phase Beta (PtNi) Al. The noted 19.1 weight percent Pt near the surface of additive layer appears to reduce to about 13.6 weight percent at a location above the diffusion zone. Other major constituents, namely Ni, Al, Cr and Co appear to remain fairly uniform in the additive layer. Furthermore, it is interesting to note that for the present condition, the (PtNi) Al exhibits about 5.5 weight percent solubility for each element Co & Cr and also that a relatively higher level of 26 weight percent Al is obtained in the single phase additive layer.

In accordance with the present invention it is shown that in addition to the PVD processes, low cost CVD type diffusion processes can be utilized to produce chromium and active elements modified Platinum Nickel Aluminide coatings. Different diffusion paths such as those indicated in Methods A and B can be adopted to produce tailored coatings. With the use of a Low Activity Aluminization process, a multiphase structure was developed for the Cr/Pt/Al processing sequence and a single phase additive layer was developed for the Pt/Cr/Al processing sequence. An important development from the current work is the generation of a new Platinum/Chromium/Nickel/Aluminide which is referred to as LI Phase in the Platinum Nickel Aluminides System. The present disclosure thus provides means to produce wide spectrum advanced EBC as well as improved Bond Coats for TBC applications.

The processing steps provided for Method A and Method B can be conveniently utilized to impart different duplex microstructures onto an HPT blade component. For example, if a multiphase additive layer is desired in the shank area and a chromium containing single phase structure is desired for the gas path, then the sequential processing steps to generate such coatings might be: a) platinum plate only the gas path areas, with a follow-on diffusion, b) carry out a chromium diffusion of the entire blade over the dove tail, c) platinum plate only the shank, with diffusion, and d) finally aluminize the entire blade except for the dove tail. If on the other hand, as a second example, a single phase is desired at the shank area and a multiphase is desired on the gas path surfaces, then the sequential steps may be: a) platinum plate only the shank area, with diffusion, b) perform chromium diffusion above the dove tail section, c) platinum plate the gas path areas only, with diffusion, and d) finally aluminize the entire blade except for the dove tail section. Yet in another example, the shank area is maintained in the chromium diffused condition while the gas path areas are processed to obtain the microstructures produced by either Method A or Method B. Thus several desired variations of the duplex coating structures can be generated within the HPT blade component.

In step one of Method A (and step 3 of Method B) it is described to perform an active elements modified chromium diffusion. The following description is taken from copending patent application Ser. No. 10/836,791, for IMPROVED CHROMIUM DIFFUSION COATINGS, filed Apr. 30, 2004, which is incorporated herein by reference. The description is an acceptable method of providing the active elements modified chromium diffusion.

In one preferred embodiment a diffusion packing is prepared using chromium or chromium alloy powder, master alloy powders of active elements and/or active metal elements in elemental or alloy form, a single or multiple activator, and an inert filler. Preferably the metallic powders that are used have a mesh size equal to or below 140 mesh. The metallic powders comprise the individual elemental metals or alloys thereof.

The metals in the pack include chromium and master alloy powders consisting of the desired active elements. The chromium source may be elemental chromium or chromium alloy. Preferably a high purity chromium powder is used. Active elements may include silicon, hafnium, zirconium, yttrium, tantalum, and rhenium. Again these active elements can be present in elemental form, or in alloy form, or a combination of both. Preferably all metal sources, whether elemental or alloy, are present in a flowable powder under 140 mesh size.

In one embodiment, master alloys of a desired metallic composition are first prepared. The alloy composition includes those metallic elements that it is desired to be co-deposited by the diffusion process. Once the alloy is formed, for example in ingot form, the solid alloy can be ground or pulverized in order to create the powder to be used in the packing. The solid alloy may thus be pulverized to a desired particle size suitable for the diffusion process. The master alloy powders can also be produced through the conventional atomization techniques used for powder production from molten alloys. In a further embodiment, it is preferred to combine an elemental chromium powder with a powder of a master alloy formulated to contain desired active elements.

Preferred activators include halide sources such as sources of fluorine, chlorine, iodine, and bromine. Acceptable activators include ammonium chloride, ammonium iodide, ammonium bromide, ammonium fluoride, ammonium bifluoride, elemental iodine, elemental bromine, hydrogen bromide, aluminum chloride, aluminum fluoride, aluminum bromide, and aluminum iodide. Preferred activators include ammonium chloride ($NH_4Cl$) and ammonium fluoride ($NH_4Fl$), and ammonium bifluoride.

In one embodiment it is preferred to use dual activators, that is, both a fluorine and a chlorine source within the same pack. Concentration of the halide source within the packing may be up to 20% by weight, and more preferably is up to 8% by weight. In one preferred embodiment, the halide concentration is between approximately 1% and approximately 5% by weight. Optionally, multiple activators may be various combinations of the identified halide compounds.

In one embodiment an activator is included in the packing that is in an encapsulated form. Such encapsulated activators are available from Chromalloy Israel, Ltd, Israel. An encapsulated activator is an activator, such as a halide compound, with a covering that surrounds the activator. The encapsulation thus acts to protect the halide from the surrounding environment and also minimizes any reactions the halide compounds might otherwise undergo. The encapsulating material, typically an organic polymer, evaporates during heating at which time the halide compound is released to participate in the diffusion process. A practical advantage of using the encapsulated form of activator is that it extends the useful shelf life of a packing. Thus a packing can be mixed, prepared, or manufactured at one location and then distributed to repair facilities. The packing can then be stored at the repair facilities until needed without losing its effectiveness.

Inert materials include metal oxides such as alumina $Al_2O_3$. Other preferred inert materials include kaolin, MgO, $SiO_2$, $Y_2O_3$ or $Cr_2O_3$. The inert fillers may be used singly or in combination. Preferably the inert materials have a non-sintered, flowable grain structure so as not to interfere with the gas transport diffusion of the desired metals.

The packing of the present invention can have varying concentrations of the metallic components within them. In one embodiment, the chromium concentration is between about 5 to about 20%; and the master alloy powder consisting of active elements (Hf, Si, Y, and others) is between about 1% to about 20% by weight. In another embodiment the chromium concentration is between about 5% to about 20%, silicon is between about 0.5% to about 10%; hafnium is between about 0.5 to about 8%; yttrium is between about 0.05 to about 5.0%; and other elements are between about 0 to about 5%, where the other elements include refractory elements such as tantalum, rhenium, zirconium etc. Also to be included are alloys of these metals.

It is also included within the scope of the invention to use mixtures of about 5% to about 20% chromium, about 1.0% to about 20% master alloy powder 0 to about 5.0% of active elements (Hf, Si, and Y), and 0 to about 5% refractory elements Ta, Re, and Zr.

These percentages are measured on a weight percentage basis comparing the metal to metal concentrations. As a whole, the metal component in the packing for coating (which includes activator and inert materials) can be between about 10% to about 90% with a range of about 15% to about 25% being preferred.

Other preferred embodiments of the active element composition include alloys of chromium, hafnium, nickel, yttrium, and silicon. Alternatively, a desired formulation can be created by combining chromium powder with a powdered master alloy of hafnium, nickel, yttrium, and silicon. Preferred formulations of these embodiments are based on a pack composition comprising approximately 15 to 40% by total weight metal or metal alloy powder, approximately 1 to 5% by weight activator, and the rest inert material such as alumina. A preferred formulation comprises approximately 20% by weight metal powder, approximately 2% activator, and the rest inert material. Some preferred compositions of the active elements component master alloy are as follows, with weight percentages being approximate:

| | Nominal Composition of Master Alloy | | | | |
|---|---|---|---|---|---|
| | A | B | C | D | E |
| Hf | 25% | 30% | 40% | 30% | 40% |
| Ni | 5% | 10% | 15% | 15% | 20% |
| Y | 0.5% | 0.5% | 0.5% | 5.0% | 10% |
| Si | bal. | bal. | bal. | bal. | bal. |

Chromium is then added to these compositions to reach a desired level of total metal in the alloy or in the pack, such as between 15% and 40%. In a preferred embodiment, master alloys of hafnium, nickel, yttrium, and silicon are prepared. Powders of this alloy are then combined with chromium powder as the metal additive in the pack.

A further embodiment adds additional materials such as zirconium, rhenium, and tantalum. These metals can be added up to 5% by weight in formulations A, B, C, D and E. Preferably these materials are included in the same alloy as that including hafnium, nickel, yttrium, and silicon.

It is within the scope of the invention to provide metal powder that is either elemental of each metal or is an alloy of metals. Further the combination of metals in elemental form with metals in alloy form can be adjusted to affect the thermodynamic activity with respect to a given halide activator or activators. Metals in their elemental form tend to have a higher activity for the formation of halide precursors. Elements in the master alloy powders tend to provide a lower activity. Thus, for example if it is desired to increase the diffusion of a given metal, it can be added to the pack in elemental form.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

We claim:

1. A turbine blade surface coating having a weight composition comprising:

| | |
|---|---|
| Al | about 8 to about 30%; |
| Cr | about 5 to about 30%; |
| Co | about 3 to about 10%; |
| Pt | about 34 to about 45%; |
| Hf | about 0.5 to about 8%; |
| Si | about 1 to about 6%; |
| Y | about 0.05 to about 0.5%; |
| X | up to about 5%, wherein X is one or more elements selected from the group consisting of tantalum, rhenium, and zirconium; and Ni. |

2. A turbine blade surface coating having a weight composition comprising:
about 20 to about 45% Ni, about 10% to about 20% Cr, about 15% to about 30% Al, about 34% to about 45% Pt, about 1.5% to about 6.0% Hf, and about 3.5% to about 4.5% Si.

3. The turbine blade surface coating according to claim 2 having a nominal weight composition comprising:

| | |
|---|---|
| Ni | 24 |
| Cr | 10 |
| Al | 21 |
| Pt | 40 |
| Hf | 1.5 |
| Si | 3.5. |

4. A turbine blade comprising:
a superalloy substrate; and
a bond coating having a weight composition comprising:

| | |
|---|---|
| Al | about 8 to about 30%, |
| Cr | about 5 to about 30%, |
| Co | about 3 to about 10%, |
| Pt | about 34 to about 45%, |
| Hf | about 0.5 to about 8%, |
| Si | about 1 to about 6%, |
| Y | about 0.05 to about 0.5%, |
| X | up to about 5%, wherein X is one or more elements selected from the group consisting of tantalum, rhenium, and zirconium; and Ni. |

5. The turbine blade according to claim 4 further comprising a thermal barrier coating on top of the bond coating.

6. The turbine blade according to claim 4 wherein the bond coating is deposited onto the substrate by an EBPVD process.

7. A turbine blade comprising:
a superalloy substrate; and
a bond coating having a weight composition comprising about 24 to about 32% Ni, about 10% to about 15% Cr, about 21% to about 24% Al, about 34% to about 40% Pt, about 1.5% to about 6.0% Hf, and about 3.5% to about 4.5% Si.

8. The turbine blade according to claim 7 wherein the bond coating consists essentially of an alloy having a weight composition of about 24 to about 32% Ni, about 10% to about 15% Cr, about 21% to about 24% Al, about 34% to about 40% Pt, about 1.5% to about 6.0% Hf, and about 3.5% to about 4.5% Si.

9. The turbine blade according to claim 7 further comprising a thermal barrier coating on top of the bond coating.

10. The turbine blade according to claim 7 wherein the bond coating is deposited onto the substrate by an EBPVD process.

11. A method of coating a turbine blade comprising the steps of:
loading an ingot of an alloy into an EBPVD feeder, wherein the alloy comprises

| | |
|---|---|
| Al | about 8 to about 30%, |
| Cr | about 5 to about 30%, |
| Co | about 3 to about 10%, |
| Pt | about 15 to about 45%, |
| Hf | about 0.5 to about 8%, |
| Si | about 1 to about 6%, |
| Y | about 0.05 to about 0.5%, |
| X | about 0 to about 5%, and wherein X comprises one or more of tantalum, rhenium, or zirconium; placing a turbine blade into an EBPVD vacuum chamber; directing an electron beam from an electron gun onto the the alloy ingot; and directing an electron beam from an electron gun onto the turbine blade. |

12. The method according to claim 11 further comprising the steps of:
preparing an alloy,
converting the alloy ingot form, and
cutting the ingot to desired lengths prior to loading the ingot into the EBPVD feeder.

13. The method according to claim 11 further comprising the step of rotating the turbine blade while directing the electron beam from the electron gun onto the turbine blade.

14. The method according to claim 11 wherein the alloy comprises
about 24 to about 32% Ni, about 10% to about 15% Cr, about 21% to about 24% Al, about 22% to about 40% Pt, about 1.5% to about 6.0% Hf, and about 3.5% to about 4.5% Si.

15. A method for providing a coating comprising the steps of:
forming an active elements modified chromium diffusion coating on a nickel-containing substrate;
depositing at least one noble metal onto the chromium diffusion coating to a thickness in the range of 3 to 12 microns;
performing a diffusion cycle in the temperature range of approximately 1800° F. to 2000° F. to form a Ni/Cr/noble metal layer; and
performing an aluminizing step after performing the diffusion cycle to generate active elements and chromium containing platinum nickel aluminide microstructures in the coating.

16. The method according to claim 15 further comprising the step of performing a post coat diffusion treatment in the 1900° F. to 2025° F. temperature range after performing the aluminizing step.

17. The method according to claim 15 wherein the step of forming a diffusion coating is a chromium diffusion alone.

18. The method according to claim 15 wherein the step of depositing noble metals comprises depositing a layer of platinum.

19. The method according to claim 15 wherein the step of depositing noble metals is performed by electroplating or PVD.

20. The method according to claim 15 wherein the step of performing an aluminizing steps comprises a Low Activity or Intermediate Activity or High Activity aluminizing step.

21. The method according to claim 15 wherein a multiphase additive layer containing a platinum, chromium, nickel aluminide LI phase is formed.

22. A method for providing a coating comprising the steps of:
depositing at least one noble metal to a thickness in the range of 3 to 12 microns onto a nickel-containing substrate;
diffusing the at least one noble metal in the 1800 to 2000° F. temperature range;
forming an active elements modified chromium diffusion coating on the substrate;
performing a diffusion cycle to form a Ni/Cr/noble metal layer after diffusing the at least one noble metal and forming the active elements modified chromium diffusion coating, the diffusion cycle being in the temperature range of approximately 1800° F. to 2000° F.; and
performing an aluminizing step to generate active elements and chromium containing platinum nickel aluminide microstructures in the coating.

23. The method according to claim 22 further comprising the step of performing a post coat diffusion treatment in the 1900° F. to 2025° F. temperature range after performing the aluminizing step.

24. The method according to claim 22 wherein the step of forming a diffusion coating is a chromium diffusion alone.

25. The method according to claim 22 wherein the step of depositing noble metals comprises depositing a layer of platinum.

26. The method according to claim 22 wherein the step of depositing noble metals further comprises depositing through the procedures of electroplating or PVD.

27. The method according to claim 22 wherein the step of performing an aluminizing steps comprises a Low Activity or Intermediate Activity or High Activity aluminizing step.

* * * * *

UNITED STATES PATENT AND TRADEMARK OFFICE
CERTIFICATE OF CORRECTION

PATENT NO. : 7,229,701 B2
APPLICATION NO. : 10/928545
DATED : June 12, 2007
INVENTOR(S) : Murali Madhava et al.

Page 1 of 1

It is certified that error appears in the above-identified patent and that said Letters Patent is hereby corrected as shown below:

Column 14, line 45, the formula should read

-- A method of coating a turbine blade comprising the steps of:
loading an ingot of an alloy into an EBPVD feeder, wherein the alloy comprises

| | |
|---|---|
| Al | about 8 to about 30%, |
| Cr | about 5 to about 30%, |
| Co | about 3 to about 10%, |
| Pt | about 15 to about 45%, |
| Hf | about 0.5 to about 8%, |
| Si | about 1 to about 6%, |
| Y | about 0.05 to about 0.5%, |
| X | about 0 to about 5%, and |
| Ni, | | wherein X comprises one or more of tantalum, rhenium, or zirconium;
placing a turbine blade into an EBPVD vacuum chamber;
directing an electron beam from an electron gun onto the alloy ingot; and
directing an electron beam from an electron gun onto the turbine blade--;

Column 15, line 37, "steps" should be changed to --step--;
Column 16, line 35, "steps" should be changed to --step--.

Signed and Sealed this

Twenty-seventh Day of November, 2007

JON W. DUDAS
*Director of the United States Patent and Trademark Office*